(12) United States Patent
Yoshitake et al.

(10) Patent No.: US 8,373,286 B2
(45) Date of Patent: Feb. 12, 2013

(54) CURABLE ORGANOPOLYSILOXANE COMPOSITION, OPTICAL SEMICONDUCTOR ELEMENT SEALANT, AND OPTICAL SEMICONDUCTOR DEVICE

(75) Inventors: Makoto Yoshitake, Funabashi (JP); Hiroji Enami, Ichihara (JP); Tomoko Kato, Ichihara (JP); Masayoshi Terada, Ichihara (JP)

(73) Assignee: Dow Corning Toray Co., Ltd., Chiyoda-ku, Tokyo (JP)

( * ) Notice: Subject to any disclaimer, the term of this patent is extended or adjusted under 35 U.S.C. 154(b) by 99 days.

(21) Appl. No.: 13/062,374

(22) PCT Filed: Sep. 4, 2009

(86) PCT No.: PCT/JP2009/065885
§ 371 (c)(1),
(2), (4) Date: May 25, 2011

(87) PCT Pub. No.: WO2010/027105
PCT Pub. Date: Mar. 11, 2010

(65) Prior Publication Data
US 2011/0227235 A1 Sep. 22, 2011

(30) Foreign Application Priority Data

Sep. 5, 2008 (JP) .................................. 2008-228980
Feb. 5, 2009 (JP) .................................. 2009-025254

(51) Int. Cl.
*H01L 23/29* (2006.01)
(52) U.S. Cl. .................... 257/791; 257/E23.12; 257/99; 257/788; 438/124; 438/126; 528/15; 528/31; 525/407
(58) Field of Classification Search ........... 257/E23.116, 257/E23.12, 99, 100, 103, 788, 791; 528/10, 528/15, 25, 31, 32, 43; 428/447; 525/100, 525/407, 477, 478; 438/22, 112, 124, 126, 438/127

See application file for complete search history.

(56) References Cited

U.S. PATENT DOCUMENTS
(Continued)

FOREIGN PATENT DOCUMENTS
JP 2003128922 A 5/2003
JP 2004292807 A 10/2004
(Continued)

OTHER PUBLICATIONS

English language abstract for JP 2003128922 extracted from the espacenet.com database on Sep. 13, 2011, 11 pages.

(Continued)

*Primary Examiner* — Chris Chu
(74) *Attorney, Agent, or Firm* — Howard & Howard Attorneys PLLC (57) ABSTRACT

A curable organopolysiloxane composition and an optical semiconductor element sealant, each comprising (A) a diorganopolysiloxane that has at least 2 alkenyl groups wherein at least 70 mole % of all the siloxane units are methylphenylsiloxane units and the total content of 1,3,5-trimethyl-1,3,5-triphenylcyclotrisiloxane and 1,3,5,7-tetramethyl-1,3,5,7-tetraphenylcyclotetrasiloxane is no more than 5 weight %, (B) an organopolysiloxane that has at least 2 silicon-bonded hydrogen atoms wherein at least 15 mole % of the silicon-bonded organic groups are phenyl groups, and (C) a hydrosilylation reaction catalyst. An optical semiconductor device in which an optical semiconductor element within a housing is sealed with the cured product from the aforementioned composition.

16 Claims, 1 Drawing Sheet

U.S. PATENT DOCUMENTS

| | | | |
|---|---|---|---|
| 5,661,210 A | 8/1997 | Burns et al. | |
| 6,806,509 B2 | 10/2004 | Yoshino et al. | |
| 7,323,250 B2 * | 1/2008 | Tabei et al. | 428/447 |
| 7,527,871 B2 | 5/2009 | Morita et al. | |
| 7,622,539 B2 * | 11/2009 | Fukui et al. | 528/32 |
| 7,632,909 B2 * | 12/2009 | Araki et al. | 528/12 |
| 7,705,104 B2 * | 4/2010 | Yamakawa et al. | 528/31 |
| 7,763,697 B2 | 7/2010 | Kato et al. | |
| 7,781,560 B2 * | 8/2010 | Ushio et al. | 528/34 |
| 7,842,755 B2 | 11/2010 | Morita et al. | |
| 8,093,331 B2 * | 1/2012 | Fukui | 524/588 |
| 8,138,254 B2 * | 3/2012 | Fukui | 524/430 |
| 8,158,265 B2 * | 4/2012 | Kimura | 428/447 |
| 8,217,388 B2 * | 7/2012 | Kato et al. | 257/40 |
| 2009/0179180 A1 | 7/2009 | Morita et al. | |

FOREIGN PATENT DOCUMENTS

| | | | |
|---|---|---|---|
| JP | 2005105217 A | 4/2005 | |
| JP | 2006063092 A | 3/2006 | |
| JP | 2007103494 | 4/2007 | |
| JP | 2008001828 A | 1/2008 | |
| WO | WO 2006011676 A1 | 2/2006 | |
| WO | WO 2007100445 A2 | 9/2007 | |
| WO | WO 2010050625 A1 | 5/2010 | |

OTHER PUBLICATIONS

English language abstract for JP 2004292807 extracted from the espacenet.com database on Sep. 13, 2011, 20 pages.

English language abstract for JP 2005105217 extracted from the espacenet.com database on Sep. 13, 2011, 20 pages.

English language abstract for JP 2006063092 extracted from the espacenet.com database on Sep. 13, 2011, 35 pages.

English language abstract and translation for JP 2007103494 extracted from the PAJ database on Sep. 13, 2011, 85 pages.

English language abstract for JP 2008001828 extracted from the espacenet.com database on Sep. 13, 2011, 17 pages.

International Search Report for Application No. PCT/JP2009/065885 dated Dec. 2, 2009, 3 pages.

International Search Report for Application No. PCT/JP2009/069014 dated Feb. 1, 2010, 3 pages.

* cited by examiner

CURABLE ORGANOPOLYSILOXANE COMPOSITION, OPTICAL SEMICONDUCTOR ELEMENT SEALANT, AND OPTICAL SEMICONDUCTOR DEVICE

RELATED APPLICATIONS

This application claims priority to and all the advantages of International Patent Application No. PCT/JP2009/065885, filed on Sep. 4, 2009, which claims priority to Japanese Patent Application No. JP2008-228980, filed on Sep. 5, 2008 and Japanese Patent Application No. JP2009-025254, filed Feb. 5, 2009.

TECHNICAL FIELD

The present invention relates to a curable organopolysiloxane composition, an optical semiconductor element sealant, specifically encapsulant, i.e., a sealant, specifically encapsulant for an optical semiconductor element, and an optical semiconductor device. The present invention more particularly relates to a hydrosilylation reaction-curable organopolysiloxane composition and an optical semiconductor element sealant, specifically encapsulant, i.e., a sealant, specifically encapsulant for an optical semiconductor element that each forms a cured product which exhibits a high refractive index, a high optical transmittance, and a highly durable adhesion to substrates. The present invention further relates to an optical semiconductor device in which an optical semiconductor element is sealed, specifically encapsulated with the cured product from the aforementioned optical semiconductor element sealant, specifically encapsulant, i.e., a sealant, specifically encapsulant for an optical semiconductor element.

BACKGROUND ART

Curable organopolysiloxane compositions that cure by the hydrosilylation reaction are used in optical semiconductor devices such as photocouplers, light-emitting diodes, solid-state imaging elements, and so forth as, for example, protective coatings and sealants for optical semiconductor elements. Since an optical semiconductor element emits or receives light, these protective coatings and sealants for optical semiconductor elements must not absorb or scatter light. As a consequence, Patent References 1 to 5 provide hydrosilylation reaction-curable organopolysiloxane compositions that, through the use of organopolysiloxane having a high phenyl content, are able to form cured products that exhibit a high refractive index and a high optical transmittance.

However, the present inventors noted that these curable organopolysiloxane compositions had the following problems: their cured products do not always exhibit a high optical transmittance; they exhibit a poor durability of adhesion for the semiconductor element or optical semiconductor element, lead frame, and package in contact with the composition during its cure, resulting in facile detachment. With regard to semiconductor devices provided with a semiconductor element that has been coated or sealed with these curable organopolysiloxane compositions or an optical semiconductor device provided with an optical semiconductor element that has been coated or sealed with these curable organopolysiloxane compositions, the present inventors also noted the problems of a poor durability of adhesion and an unsatisfactory reliability.

A curable organopolysiloxane composition that solves these problems is disclosed in Patent Reference 6. However, the present inventors noted the following problem with this curable organopolysiloxane composition: because an essential component of this composition is a radical copolymer-type adhesion promoter, when an optical semiconductor element coated or sealed with a cured product from this composition is subjected to long-term use at high temperatures, this cured product undergoes yellowing and the optical transmittance declines.

PRIOR ART REFERENCES

Patent References

[Patent Reference 1] JP 2003-128922 A
[Patent Reference 2] JP 2004-292807 A
[Patent Reference 3] JP 2005-105217 A
[Patent Reference 4] JP 2007-103494 A
[Patent Reference 5] JP 2008-001828 A
[Patent Reference 6] JP 2006-063092 A

SUMMARY OF THE INVENTION

Problems to be Solved by the Invention

An object of the present invention is to provide a curable organopolysiloxane composition that forms a cured product which exhibits a high refractive index, a high optical transmittance, and a highly durable adhesion to substrates such as a semiconductor element, lead frame, package, and so forth in contact with the composition during its cure. A further object of the present invention is to provide an optical semiconductor element sealant, specifically encapsulant that forms a cured product that exhibits a high refractive index, a high optical transmittance, and a highly durable adhesion to, for example, optical semiconductor elements, lead frames, packages, and so forth, in contact with the sealant, specifically encapsulant during its cure. A further object of the present invention is to provide a highly reliable optical semiconductor device that is sealed, specifically encapsulated with an optical semiconductor element sealant, specifically encapsulant that exhibits a highly durable adhesion to, for example, optical semiconductor elements, lead frames, packages, and so forth.

Means Solving the Problems

The aforementioned objects are achieved by
"[1] A curable organopolysiloxane composition that comprises
(A) a diorganopolysiloxane that has at least 2 alkenyl groups in one molecule wherein at least 70 mole % of all the siloxane units in the diorganopolysiloxane are methylphenylsiloxane units and the total content of 1,3,5-trimethyl-1,3,5-triphenylcyclotrisiloxane and 1,3,5,7-tetramethyl-1,3,5,7-tetraphenylcyclotetrasiloxane is no more than 5 weight %,
(B) an organopolysiloxane that has at least 2 silicon-bonded hydrogen atoms in one molecule wherein at least 15 mole % of the silicon-bonded organic groups in the organopolysiloxane are phenyl groups in a quantity that provides 10 to 500% for the number of moles of silicon-bonded hydrogen atoms in component (B) relative to the total number of moles of alkenyl groups in component (A), and
(C) a hydrosilylation reaction catalyst in a quantity sufficient to cure the composition.

[2] The curable organopolysiloxane composition according to [1], characterized in that component (A) is a diorganopolysiloxane represented by the following average structural formula (1):

wherein Me is methyl; Ph is phenyl; $R^1$ is alkenyl, methyl, and phenyl; at least 2 of the $R^1$ groups in one molecule are alkenyl groups; the sum of n and m is a number with an average from 5 to 1,000; and m/n is no greater than 0.2, and component (B) is an organohydrogenpolysiloxane selected from a straight-chain organohydrogenpolysiloxane represented by the following average structural formula (2):

wherein $R^2$ is hydrogen, methyl, or phenyl; at least 2 of the $R^2$ groups in one molecule are hydrogen atoms; at least 15 mole % of the non-hydrogen $R^2$ groups are phenyl groups; and p is a number with an average of 0 to 1,000 and a branched organohydrogenpolysiloxane represented by the following average siloxane unit formula (3):

$$R^3{}_a H_b SiO_{(4-a-b)/2} \quad (3)$$

wherein $R^3$ is methyl and phenyl and at least 15 mole % of the $R^3$ groups are phenyl groups; a is a number with an average of $0.5 \leq a < 2.0$; b is a number with an average of $0.5 \leq b < 2.0$; and a+b is a number with an average of $1.0 \leq a+b < 2.0$.

[3] The curable organopolysiloxane composition according to [1], that further comprises a methylphenylalkenylpolysiloxane represented by the following average unit formula (4):

$$R^4{}_c SiO_{(4-c)/2} \quad (4)$$

wherein $R^4$ is alkenyl, methyl, and phenyl wherein at least 20 mole % of the $R^4$ groups are phenyl groups, and c is a positive number with an average of 0.5 to 1.7 at up to 50 weight % with reference to the total quantity of components (A) and (B).

[4] The curable organopolysiloxane composition according to [2], that further comprises a methylphenylalkenylpolysiloxane represented by the following average unit formula (4):

$$R^4{}_c SiO_{(4-c)/2} \quad (4)$$

wherein $R^4$ is alkenyl, methyl, and phenyl wherein at least 20 mole % of the $R^4$ groups are phenyl groups, and c is a positive number with an average of 0.5 to 1.7, at up to 50 weight % with reference to the total quantity of components (A) and (B).

[5] The curable organopolysiloxane composition according to [1] or [2], that forms a cured product that has a refractive index at 25° C. for visible light with a wave length of 589 nm of at least 1.5 and an optical transmittance at 25° C. for visible light of at least 80%.

[6] The curable organopolysiloxane composition according to [3] or [4], that forms a cured product that has a refractive index at 25° C. for visible light with a wave length of 589 nm of at least 1.5 and an optical transmittance at 25° C. for visible light of at least 80%."

The aforementioned objects are also achieved by

"[7] An optical semiconductor element sealant that comprises
(A) a diorganopolysiloxane that has at least 2 alkenyl groups in one molecule wherein at least 70 mole % of all the siloxane units in the diorganopolysiloxane are methylphenylsiloxane units and the total content of 1,3,5-trimethyl-1,3,5-triphenylcyclotrisiloxane and 1,3,5,7-tetramethyl-1,3,5,7-tetraphenylcyclotetrasiloxane is no more than 5 weight %,
(B) an organopolysiloxane that has at least 2 silicon-bonded hydrogen atoms in one molecule wherein at least 15 mole % of the silicon-bonded organic groups in the organopolysiloxane are phenyl groups in a quantity that provides 10 to 500% for the number of moles of silicon-bonded hydrogen atoms in component (B) relative to the total number of moles of alkenyl groups in component (A), and
(C) a hydrosilylation reaction catalyst in a quantity sufficient to cure the composition, and forms a cured product that has a refractive index at 25° C. for visible light with a wave length of 589 nm of at least 1.5 and an optical transmittance at 25° C. for visible light of at least 80%.

[8] The optical semiconductor element sealant according to [7], characterized in that component (A) is a diorganopolysiloxane represented by the following average structural formula (1):

wherein Me is methyl; Ph is phenyl; $R^1$ is alkenyl, methyl, and phenyl; at least 2 of the $R^1$ groups in one molecule are alkenyl groups; the sum of n and m is a number with an average from 5 to 1,000; and m/n is no greater than 0.2, and component (B) is an organohythogenpolysiloxane selected from a straight-chain organohydrogenpolysiloxane represented by the following average structural formula (2):

wherein $R^2$ is hydrogen, methyl, or phenyl; at least 2 of the $R^2$ groups in one molecule are hydrogen atoms; at least 15 mole % of the non-hydrogen $R^2$ groups are phenyl groups; and p is a number with an average of 0 to 1,000 and a branched organohydrogenpolysiloxane represented by the following average unit formula (3):

$$R^3{}_a H_b SiO_{(4-a-b)/2} \quad (3)$$

wherein $R^3$ is methyl and phenyl and at least 15 mole % of the $R^3$ groups are phenyl groups; a is a number with an average of $0.5 \leq a < 2.0$; b is a number with an average of $0.5 \leq b < 2.0$; and a+b is a number with an average of $1.0 \leq a+b < 2.0$.

[9] The optical semiconductor element sealant according to [7], that further comprises a methylphenylalkenylpolysiloxane represented by the following average unit formula (4):

$$R^4{}_c SiO_{(4-c)/2} \quad (4)$$

wherein $R^4$ is alkenyl, methyl, and phenyl wherein at least 20 mole % of the $R^4$ groups are phenyl groups, and c is a positive number with an average of 0.5 to 1.7 at up to 50 weight % with reference to the total quantity of components (A) and (B).

[10] The optical semiconductor element sealant according to [8], that further comprises a methylphenylalkenylpolysiloxane represented by the following average unit formula (4):

$$R^4{}_c SiO_{(4-c)/2} \quad (4)$$

wherein $R^4$ is alkenyl, methyl, and phenyl wherein at least 20 mole % of the $R^4$ groups are phenyl groups, and c is a positive number with an average of 0.5 to 1.7 at up to 50 weight % with reference to the total quantity of components (A) and (B).

[11] The optical semiconductor element sealant according to [7] or [8], characterized in that the optical semiconductor element is a light-emitting semiconductor element.

[12] The optical semiconductor element sealant according to [11], characterized in that the light-emitting semiconductor element is a light-emitting diode element."

The aforementioned objects are also achieved by

"[13] An optical semiconductor device that is provided with an optical semiconductor element, characterized in that the optical semiconductor element is sealed with a cured product from an optical semiconductor element sealant according to [7] or [8].

[14] An optical semiconductor device that is provided with an optical semiconductor element, characterized in that the optical semiconductor element is sealed with a cured product from an optical semiconductor element sealant according to [9] or [10].

[15] The optical semiconductor device according to [13], characterized in that the optical semiconductor device is provided with an optical semiconductor element within a housing and in that this optical semiconductor element is sealed with a cured product from an optical semiconductor element sealant according to [7] or [8] along with the inner wall of the housing.

[16] The optical semiconductor device according to [14], characterized in that the optical semiconductor device is provided with an optical semiconductor element within a housing and in that this optical semiconductor element is sealed with a cured product from an optical semiconductor element sealant according to [9] or [10] along with the inner wall of the housing."

Effects of the Invention

The curable organopolysiloxane composition of the present invention characteristically forms a cured product that exhibits a high refractive index, a high optical transmittance, and a highly durable adhesion to any of various substrates in contact with the composition during its cure.

The optical semiconductor element sealant, specifically encapsulant of the present invention characteristically forms a cured product that exhibits a high refractive index, a high optical transmittance, and a highly durable adhesion to, for example, optical semiconductor elements, lead frames, packages, and so forth, in contact with the sealant, specifically encapsulant during its cure. In particular, the optical semiconductor element sealant, specifically encapsulant of the present invention forms a cured product that exhibits a highly durable adhesion when the sealed, specifically encapsulated semiconductor element, lead frame, package, and so forth, is subjected to hot/cold cycling.

The optical semiconductor device of the present invention—because, for example, the optical semiconductor element, lead frame, package, etc., therein is or are sealed, specifically encapsulated with a cured product from the aforementioned optical semiconductor element sealant, specifically encapsulant—is characterized by a highly durable adhesion and an excellent reliability. In particular, the optical semiconductor device of the present invention is characterized by a highly durable adhesion when the sealed, specifically encapsulated optical semiconductor device is subjected to hot/cold cycling.

MODES FOR CARRYING OUT THE INVENTION

The curable organopolysiloxane composition of the present invention and the optical semiconductor element sealant, specifically encapsulant of the present invention both comprise (A) a diorganopolysiloxane that has at least 2 alkenyl groups in one molecule wherein at least 70 mole % of all the siloxane units in the diorganopolysiloxane are methylphenylsiloxane units and the total content of 1,3,5-trimethyl-1,3,5-triphenylcyclotrisiloxane and 1,3,5,7-tetramethyl-1,3,5,7-tetraphenylcyclotetrasiloxane is no more than 5 weight %, (B) an organopolysiloxane that has at least 2 silicon-bonded hydrogen atoms in one molecule wherein at least 15 mole % of the silicon-bonded organic groups in the organopolysiloxane are phenyl groups in a quantity that provides 10 to 500% for the number of moles of silicon-bonded hydrogen atoms in component (B) relative to the total number of moles of alkenyl groups in component (A), and (C) a hydrosilylation reaction catalyst in a quantity sufficient to cure the composition.

This composition and optical semiconductor element sealant, specifically encapsulant both cure by a hydrosilylation reaction-mediated crosslinking between the alkenyl group in component (A) and the silicon-bonded hydrogen atom in component (B) under the catalytic action of component (C). At least 2 alkenyl groups are therefore required in one molecule of component (A). The alkenyl group may be in molecular chain terminal position, along the molecular chain, or in both molecular chain terminal position and along the molecular chain.

The alkenyl group in component (A) is exemplified by vinyl, allyl, butenyl, pentenyl, and hexenyl, wherein vinyl is preferred from the standpoints of the ease of component (A) synthesis and the hydrosilylation reactivity. In addition, alkenyl, methyl, and phenyl are required silicon-bonded organic groups in component (A) since at least 70 mole % of all the siloxane units are methylphenylsiloxane units in component (A). In addition to these groups, for example, alkyl group excluding methyl group may also be present. This alkyl group can be exemplified by ethyl, propyl, butyl, pentyl, hexyl, and heptyl. The molecular structure of component (A) is straight chain or cyclic, but may be partially branched within a range in which the properties of this diorganopolysiloxane are not lost.

At least 70 mole % of all the siloxane units are methylphenylsiloxane units in component (A) because this provides the crosslinked and cured product from components (A) and (B) with a low light attenuation due to refraction, reflection, scattering, and so forth. The siloxane units other than the methylphenylsiloxane unit can be exemplified by dimethylsiloxane unit, methylvinylsiloxane unit, diphenylsiloxane unit, phenylvinylsiloxane unit, methylalkyl (excluding methyl) siloxane unit, dimethylvinylsiloxane unit, trimethylsiloxane unit, and methylphenylvinylsiloxane unit. For the same reason as above, the silicon-bonded phenyl group is preferably at least 35 mole % of all the silicon-bonded organic groups in component (A).

Component (A) is preferably a liquid at ambient temperature when one considers the handling characteristics and moldability of the curable organopolysiloxane composition and optical semiconductor element sealant, specifically encapsulant of the present invention. The viscosity of component (A) at 25° C. is preferably in the range from 10 to 1,000,000 mPa·s and particularly preferably is in the range from 100 to 50,000 mPa·s. The reasons for this are as follows: the mechanical strength of the resulting cured product declines when the viscosity of component (A) is below the lower limit on the aforementioned range; on the other hand, the handling characteristics of the resulting composition decline when the upper limit on the aforementioned range is exceeded.

A representative example of component (A) is a straight-chain diorganopolysiloxane represented by the following average structural formula (1):

(1)

wherein Me is methyl; Ph is phenyl; and $R^1$ is alkenyl, methyl, and phenyl wherein at least 2 of the $R^1$ groups in one molecule are alkenyl groups; the sum of n and m is a number with an average of 5 to 1,000 and preferably is a number that provides this diorganopolysiloxane with a viscosity at 25° C. in the range from 10 to 1,000,000 mPa·s and particularly 100 to 50,000 mPa·s; and m/n is no greater than 0.2.

The alkenyl encompassed by $R^1$ in the aforementioned average structural formula can be exemplified by vinyl, allyl, butenyl, pentenyl, and hexenyl wherein vinyl is preferred from the standpoints of the ease of component (A) synthesis and the hydrosilylation reactivity. The siloxane units that have 2 $R^1$ groups are units other than methylphenylsiloxane unit selected from dimethylsiloxane unit, methylvinylsiloxane unit, diphenylsiloxane unit, and phenylvinylsiloxane unit. The siloxane units that have 3 $R^1$ groups are selected from trimethylsiloxane unit, dimethylvinylsiloxane unit, dimethylphenylsiloxane unit, and methylphenylvinylsiloxane unit.

The total content of 1,3,5-trimethyl-1,3,5-triphenylcyclotrisiloxane and 1,3,5,7-tetramethyl-1,3,5,7-tetraphenylcyclotetrasiloxane in component (A) is no more than 5 weight % based on a consideration of the durability of adhesion to substrates in contact with the component (A)—containing composition or optical semiconductor element sealant, specifically encapsulant during the cure of the composition or sealant, specifically encapsulant and in particular based on a consideration of the durability of adhesion during hot/cold cycling. The total content of 1,3,5-trimethyl-1,3,5-triphenylcyclotrisiloxane and 1,3,5,7-tetramethyl-1,3,5,7-tetraphenylcyclotetrasiloxane is preferably no greater than 3 weight % and more preferably is zero.

The content of these cyclics can be determined by quantitative analysis by headspace gas chromatography using n-undecane as internal standard. Thus, the relative intensity of 1,3,5-trimethyl-1,3,5-triphenylcyclotrisiloxane and 1,3,5,7-tetramethyl-1,3,5,7-tetraphenylcyclotetrasiloxane with respect to n-undecane is measured in advance using a reference sample and the 1,3,5-trimethyl-1,3,5-triphenylcyclotrisiloxane and 1,3,5,7-tetramethyl-1,3,5,7-tetraphenylcyclotetrasiloxane are determined from the peak intensity on the gas chromatogram and the quantity of n-undecane addition to the sample. This method also applies to determination of the content of these cyclics in the claims.

This component (A) can be produced by subjecting a cyclic methylphenylsiloxane oligomer to equilibration polymerization by heating in the presence of a molecular chain endblocking agent such as 1,3-divinyltetramethyldisiloxane or 1,3-divinyl-1,3-diphenyldimethyldisiloxane and a polymerization catalyst exemplified by potassium hydroxide, potassium dimethylsiloxanolate, tetramethylammonium hydroxide, and tetramethylammonium dimethylsiloxanolate; neutralizing or thermally degrading the polymerization catalyst; and then removing the 1,3,5-trimethyl-1,3,5-triphenylcyclotrisiloxane and 1,3,5,7-tetramethyl-1,3,5,7-tetraphenylcyclotetrasiloxane by heating under reduced pressure.

The organopolysiloxane (B), which has at least 2 silicon-bonded hydrogen atoms in one molecule wherein at least 15 mole % of the silicon-bonded organic groups in the organopolysiloxane are phenyl groups, is a crosslinker for component (A). Component (A) undergoes crosslinking and cure by the addition reaction, that is, hydrosilylation reaction of the silicon-bonded hydrogen atom in component (B) to the alkenyl group in component (A) under the catalytic action of component (C).

At least 2 silicon-bonded hydrogen atoms must be present in one molecule since curing proceeds by a hydrosilylation reaction between component (B) and component (A), while the presence of at least 3 silicon-bonded hydrogen atoms is preferred. When component (B) has a straight chain molecular structure, the silicon-bonded hydrogen atom is present only at both terminals, in side chain position and at both terminals, or only in side chain position. When component (B) has a cyclic molecular structure, the silicon-bonded hydrogen atom is present only in side chain position. When component (B) has a branched molecular structure, the silicon-bonded hydrogen atom is present, for example, only in terminal position, only in side chain position, at branch points, in both terminal and side chain position, and so forth. Ordinarily only 1 hydrogen atom is bonded to a single silicon atom, but 2 hydrogen atoms may be bonded to a single silicon atom.

At least 15 mole % of all the silicon-bonded organic groups are silicon-bonded phenyl groups in component (B) because this provides the crosslinked and cured product from components (A) and (B) with a low light attenuation due to refraction, reflection, scattering, and so forth. Preferably at least 25 mole % and particularly preferably at least 40 mole % of all the silicon-bonded organic groups are silicon-bonded phenyl groups.

A too high phenyl group content, however, reduces the transparency due to turbidity in the composition, and the phenyl group content is thus preferably no greater than 80 mole %.

The silicon-bonded organic groups other than the silicon-bonded phenyl group can be exemplified by alkyl, aralkyl, and fluoroalkyl, but alkyl group is preferred from the standpoint of the compatibility with component (A). This alkyl group can be exemplified by methyl, ethyl, propyl, butyl, pentyl, hexyl, and heptyl, but methyl group is particularly preferred from the standpoints of ease of component (B) synthesis and compatibility with component (A).

Component (B) may contain a small amount of silicon-bonded hydroxyl group or alkoxy group.

The molecular structure of this component (B) can be exemplified by straight chain, branched straight chain, branched, cyclic, and cage, and structures that are combinations of the preceding.

Component (B) is preferably a liquid at ambient temperature from the standpoint of the compatibility with component (A). While the viscosity of component (B) is not limited, it is preferably 1 to 10,000 mPa·s at 25° C. and particularly preferably is 2 to 5,000 mPa·s at 25° C. The reasons for this are as follows: when the viscosity of component (B) is less than the lower limit on the aforementioned range, this results in a facile volatilization that creates the risk of instability of the resulting composition; on the other hand, when the upper limit on the aforementioned range is exceeded, synthesis of the organopolysiloxane is not easy.

Representative examples of this component (B) are a straight-chain organohydrogenpolysiloxane represented by the following average structural formula (2):

(2)

wherein $R^2$ is hydrogen, methyl, or phenyl; at least 2 of the $R^2$ groups in one molecule are hydrogen atoms; at least 15 mole % of the non-hydrogen $R^2$ groups are phenyl groups; and p is a number with an average of 0 to 1,000 and a branched organohydrogenpolysiloxane represented by the following average unit formula (3):

(3)

wherein $R^3$ is methyl and phenyl and at least 15 mole % of the $R^3$ groups are phenyl groups; a is a number with an average of $0.5 \leq a < 2.0$; b is a number with an average of $0.5 \leq b < 2.0$; and a+b is a number with an average of $1.0 \leq a+b < 2.0$.

Here, the degree of branching increases as a+b moves from 2.0 to 1.0, and branching is fairly significant at around 1.7.

Preferably at least 50 mole % of the $R^2$ groups in the molecule are methyl group and phenyl group in the straight-chain organohydrogenpolysiloxane represented by average structural formula (2) wherein at least 15 moles % of this methyl group and phenyl group are phenyl groups. Since at least 2 and preferably at least 3 of the $R^2$ groups in the molecule are silicon-bonded hydrogen atoms, methyl group and phenyl group cannot be 100 mole % of the $R^2$ groups in the molecule. While at least 15 mole % of this methyl group and phenyl group are phenyl groups, the phenyl group is preferably no more than 80 mole % from the standpoint of the compatibility with component (A). As p is a number from 0 to 1,000, the straight-chain organohydrogenpolysiloxane can comprise oligomers.

The following are preferred examples of the straight-chain organohydrogenpolysiloxane with average structural formula (2): methylphenyldisiloxane having 2 or 3 or more silicon-bonded hydrogen atoms, and straight-chain methylphenylhydrogenpolysiloxane having 2 or 3 or more silicon-bonded hydrogen atoms in which the main chain is straight-chain methylphenylpolysiloxane, straight-chain diphenylpolysiloxane, straight-chain methylhydrogensiloxane.methylphenylsiloxane copolymer, or straight-chain methylhydrogensiloxane.diphenylsiloxane copolymer and in which both terminals are the dimethylhydrogensiloxy group, methylphenylhydrogensiloxy group, trimethylsiloxy group, or dimethylphenylsiloxy group.

A branched methylphenylhydrogenpolysiloxane represented by the average siloxane unit formula:

wherein $C_6H_5$ is phenyl; Me is methyl; x is 0.3 to 0.7; y is 0 to 0.3; z is 0.25 to 0.7; and x+y+z=1.0 is the most preferred example of the branched organohydrogenpolysiloxane with average unit formula (3).

The following are specific examples of component (B): methylphenylhydrogensiloxane oligomers and straight-chain methylphenylhydrogenpolysiloxanes represented by (HMePhSi)$_2$O, (HMe$_2$SiO)$_2$SiPh$_2$, (HMePhSiO)$_2$SiPh$_2$, (HMe$_2$SiO)$_2$SiMePh, HMe$_2$SiO(Ph$_2$SiO)$_2$SiMe$_2$H, HMe$_2$SiO(MePhSiO)$_2$SiMe$_2$H, HMe$_2$SiO(Ph$_2$SiO)$_4$SiMe$_2$H, HMe$_2$SiO(MePhSiO)$_4$SiMe$_2$H, HMe$_2$SiO(MePhSiO)$_{20}$SiMe$_2$H, HMePhSiO(MePhSiO)$_{20}$SiMePhH, HMePhSiO(MePhSiO)$_{17}$(MeHSiO)$_3$SiMePhH, Me$_2$PhSiO(MePhSiO)$_{17}$(MeHSiO)$_3$SiMe$_2$Ph, (HMe$_2$SiO)$_3$SiPh, (HMePhSiO)$_3$SiPh, and (HMePhSiO)$_3$SiMe; also, branched methylphenylhydrogenpolysiloxane comprising (PhSiO$_{3/2}$) units and (Me$_2$HSiO$_{1/2}$) units, branched methylphenylhydrogenpolysiloxane comprising (PhSiO$_{3/2}$) units, (Me$_2$SiO$_{2/2}$) units, and (Me$_2$HSiO$_{1/2}$) units, branched methylphenylhydrogenpolysiloxane comprising (PhSiO$_{3/2}$) units, (MePhSiO$_{2/2}$) units, and (Me$_2$HSiO$_{1/2}$) units, branched methylphenylhydrogenpolysiloxane comprising (PhSiO$_{3/2}$) units, (MeSiO$_{3/2}$) units, and (Me$_2$HSiO$_{1/2}$) units, branched methylphenylhydrogenpolysiloxane comprising (PhSiO$_{3/2}$) units and (MeHSiO$_{1/2}$) units, and branched methylphenylhydrogenpolysiloxane comprising (Me$_2$HSiO$_{1/2}$) units, (MePh$_2$SiO$_{1/2}$) units, and (SiO$_{4/2}$) units. Here, the branched configuration encompasses network configurations, cage configurations, and three-dimensional configurations, and all of these branched configurations are preferably liquid at ambient temperature.

Two or more component (B)'s that differ, for example, in their substituent groups, constituent siloxane units, degrees of polymerization, viscosity, and so forth, may be used in combination.

Component (B) can be prepared by a cohydrolysis condensation reaction or equilibration polymerization reaction according to an established method. Component (B) has a total content of 1,3,5-trimethyl-1,3,5-triphenylcyclotrisiloxane and 1,3,5,7-tetramethyl-1,3,5,7-tetraphenylcyclotetrasiloxane preferably of no more than 5 weight %, more preferably no more than 3 weight %, and most preferably zero.

The quantity of component (B) incorporation is an amount that provides 10 to 500% and preferably 50 to 200% for the number of moles of silicon-bonded hydrogen atoms in component (B) relative to the total number of moles of alkenyl groups in component (A). When the composition of the present invention contains component (D), the quantity of component (B) incorporation is an amount that provides 10 to 500%, preferably 50 to 300%, and more preferably 80 to 200% for the number of moles of silicon-bonded hydrogen atoms in component (B) relative to the sum total number of moles of alkenyl groups in component (A) and alkenyl groups in component (D). The reasons for this are follows: when the amount of component (B) incorporation is less than the lower limit for the aforementioned range, curing of the resulting composition tends to be unsatisfactory; on the other hand, the heat resistance of the resulting cured product tends to decline when the upper limit for the aforementioned range is exceeded.

The hydrosilylation reaction catalyst that is component (C) is a catalyst that promotes the hydrosilylation reaction between the alkenyl group in component (A) and the silicon-bonded hydrogen atom in component (B). This component (C) is preferably a catalyst in the form of a platinum group element or a compound of a platinum group element and can be exemplified by platinum-type catalysts, rhodium-type catalysts, and palladium-type catalysts. Platinum-type catalysts are preferred because they significantly promote the hydrosilylation reaction between components (A) and (B) and thus significantly promote curing of the composition of the present invention.

These platinum-type catalysts can be exemplified by finely divided platinum, platinum black, chloroplatinic acid, alcohol modifications of chloroplatinic acid, chloroplatinic acid/diolefin complexes, platinum/olefin complexes, platinum-carbonyl complexes such as platinum bis(acetoacetate) and platinum bis(acetylacetonate), chloroplatinic acid/alkenylsiloxane complexes such as chloroplatinic acid/divinyltetramethyldisiloxane complexes and chloroplatinic acid/tetravinyltetramethylcyclotetrasiloxane complexes, platinum/alkenylsiloxane complexes such as platinum/divinyltetramethyldisiloxane complexes and platinum/tetravinyltetramethylcyclotetrasiloxane complexes, and complexes between chloroplatinic acid and an acetylene alcohol. Platinum/alkenylsiloxane complexes are particularly preferred from the standpoint of the hydrosilylation reaction performance.

The alkenylsiloxane for such complexes can be exemplified by 1,3-divinyl-1,1,3,3-tetramethyldisiloxane, 1,3,5,7-tetramethyl-1,3,5,7-tetravinylcyclotetrasiloxane, alkenylsiloxane oligomers afforded by replacing a portion of the methyl in the preceding alkenylsiloxanes with, for example, ethyl, phenyl, and so forth, and alkenylsiloxane oligomers afforded by replacing the vinyl in the preceding alkenylsiloxanes with, for example, allyl or hexenyl. 1,3-divinyl-1,1,3,3-tetramethyldisiloxane is particularly preferred because it produces a platinum/alkenylsiloxane complex that has an excellent stability.

In addition, in order to improve the stability of these platinum/alkenylsiloxane complexes, these platinum/alkenylsiloxane complexes are preferably dissolved in an organosiloxane oligomer such as a dimethylsiloxane oligomer or an alkenylsiloxane oligomer such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, 1,3,5,7-tetramethyl-1,3,5,7-tetravinylcyclotetrasiloxane, and so forth, wherein dissolution in an alkenylsiloxane oligomer is particularly preferred.

Component (C) is incorporated in an amount that promotes the cure of the composition of the present invention or the optical semiconductor element sealant, specifically encapsulant of the present invention, but its amount of incorporation is not otherwise limited. In specific terms, component (C) is incorporated in an amount that provides preferably 0.01 to 500 weight-ppm, more preferably 0.01 to 100 weight-ppm, and particularly preferably 0.1 to 50 weight-ppm platinum group metal atoms and particularly platinum atoms in this component with reference to the composition of the present invention. The reasons for this are as follows: when the component (C) content is less than the lower limit on the aforementioned range, the cure of the composition of the present invention tends to be unsatisfactory; on the other hand, exceeding the upper limit on the aforementioned range runs the risk of creating problems such as discoloration of the resulting cured product.

An alkenyl-containing branched methylphenylpolysiloxane (D) may be incorporated in order to improve the strength and elastic modulus of the cured product from the composition of the present invention or the optical semiconductor element sealant, specifically encapsulant of the present invention. This alkenyl-containing branched methylphenylpolysiloxane can be represented by the following average unit formula (4):

$$R^4_c SiO_{(4-c)/2} \qquad (4)$$

wherein $R^4$ is alkenyl, methyl, and phenyl wherein at least 20 mole % of the $R^4$ groups are phenyl groups, and c is a positive number with an average of 0.5 to 1.7.

Since c in this average unit formula (4) has an average of 0.5 to 1.7, its molecular structure is branched, network, cage, or three dimensional or is a molecular structure in which these are present in combination. The siloxane units constituting the branched methylphenylpolysiloxane represented by average unit formula (4) are the triorganosiloxane unit (M unit), diorganosiloxane unit (D unit), monoorganosiloxane unit (T unit), and $SiO_{4/2}$ unit (Q unit).

The monoorganosiloxane unit is represented by $R^4 SiO_{3/2}$ unit and can be exemplified by $MeSiO_{3/2}$ unit, $PhSiO_{3/2}$ unit, and $ViSiO_{3/2}$ unit. The diorganosiloxane unit is represented by $R^4_2 SiO_{2/2}$ unit and can be exemplified by $MePhSiO_{2/2}$ unit, $Me_2 SiO_{2/2}$ unit, $MeViSiO_{2/2}$ unit, and $Ph_2 SiO_{2/2}$ unit. The triorganosiloxane unit is represented by $R^4_3 SiO_{1/2}$ unit and can be exemplified by $Me_3 SiO_{1/2}$ unit, $Me_2 PhSiO_{1/2}$ unit, $MeViPhSiO_{1/2}$ unit, and $MeVi_2 SiO_{1/2}$ unit. Here, Me denotes methyl; Vi denotes vinyl; and Ph denotes phenyl. In addition, these siloxane units can include siloxane units in which a portion of the $R^4$ groups is replaced by OH group, for example, $R^4(OH)SiO_{2/2}$ unit, $R^4_2(OH)SiO_{1/2}$ unit, and $(HO)SiO_{3/2}$ unit.

The following are preferred examples of component (D): a branched methylphenylvinylpolysiloxane represented by the average siloxane unit formula:

$$(C_6H_5SiO_{3/2})_x (MeSiO_{3/2})_y (ViMe_2SiO_{1/2})_z$$

wherein $C_6H_5$ is phenyl; Vi is vinyl; Me is methyl; x is 0.3 to 0.7; y is 0 to 0.3; z is 0.25 to 0.7; and x+y+z=1.0 and a branched methylphenylvinylpolysiloxane represented by the average siloxane unit formula:

$$(ViMeC_6H_5SiO_{1/2})_x (SiO_{4/2})_y$$

wherein $C_6H_5$ is phenyl; Vi is vinyl; Me is methyl; and x/y=0.75 to 4.

When component (D) is incorporated in the composition of the present invention or the optical semiconductor element sealant, specifically encapsulant of the present invention, the amount of component (D) incorporation is a quantity that preferably is no more than 50 weight % and more preferably no more than 40 weight % with reference to the total quantity of components (A) and (B). The reasons for this are as follows: when the amount of component (D) incorporation exceeds the upper limit on the indicated range, the curability of the resulting composition tends to decline and the adhesiveness to substrates of the cured product yielded by curing tends to decline.

In order to improve the storage stability and extend the pot life at ambient temperature, a hydrosilylation reaction inhibitor is preferably incorporated in the composition of the present invention and the optical semiconductor element sealant, specifically encapsulant of the present invention. This hydrosilylation reaction inhibitor can be exemplified by alkyne alcohols such as 2-methyl-3-butyn-2-ol, 3,5-dimethyl-1-hexyn-3-ol, 2-phenyl-3-butyn-2-ol, and so forth; eneyne compounds such as 3-methyl-3-penten-1-yne, 3,5-dimethyl-3-hexen-1-yne, and so forth; methylalkenylsiloxane oligomers such as 1,3,5,7-tetramethyl-1,3,5,7-tetravinylcyclotetrasiloxane, 1,3,5,7-tetramethyl-1,3,5,7-tetrahexenylcyclotetrasiloxane, and so forth; alkyneoxysilanes such as dimethylbis(3-methyl-1-butyn-3-oxy)silane, methylvinylbis(3-methyl-1-butyn-3-oxy)silane, and so forth; benzotriazole; and so forth.

This hydrosilylation reaction inhibitor is incorporated in an amount sufficient to inhibit gelation or curing when component (C) is mixed with components (A) and (B) and an amount sufficient to provide long-term storability. It is incorporated preferably at 0.0001 to 5 weight parts and more preferably 0.01 to 3 weight parts, in each case per 100 weight parts of the total of components (A) and (B).

An agent that imparts or promotes adhesion (referred to hereafter as an adhesion promoter) can be incorporated in the composition of the present invention or the optical semiconductor element sealant, specifically encapsulant of the present invention in order to provide additional improvement in the adhesiveness to substrates in contact with the composition or sealant, specifically encapsulant during the cure of the composition or sealant, specifically encapsulant. This adhesion promoter is preferably an organosilicon compound-type adhesion promoter as known for use in hydrosilylation reaction-curable organopolysiloxane compositions.

Typical examples are organosilanes and straight-chain, branched, and cyclic organosiloxane oligomers having approximately 4 to 20 silicon atoms, in each case having a trialkoxysiloxy group such as trimethoxysiloxy, triethoxysiloxy or trialkoxysilylalkyl group such as trimethoxysilylethyl, triethoxysilylethyl and a functional group selected from the group consisting of hydrosilyl group, silicon-bonded alkenyl group such as vinyl, allyl, silicon-bonded methacryloxyalkyl group such as 3-methacryloxypropyl, and silicon-bonded epoxy-functional alkyl group such as 3-glycidoxypropyl, 4-glycidoxybutyl, 2-(3,4-epoxycyclohexyl)ethyl, and 3-(3,4-epoxycyclohexyl)propyl. Other typical examples are epoxy-functional ethylpolysilicates and reaction products of an aminoalkyltrialkoxysilane with an epoxy-functional alkyltrialkoxysilane.

Specific examples are as follows: vinyltrimethoxysilane, allyltrimethoxysilane, allyltriethoxysilane, hydrogentriethoxysilane, 3-glycidoxypropyltrimethoxysilane, 3-glycidoxypropyltriethoxysilane, 2-(3,4-epoxycyclohexyl)ethyltrimethoxysilane, 3-methacryloxypropyltrimethoxysilane, 3-methacryloxypropyltriethoxysilane, reaction products of 3-glycidoxypropyltriethoxysilane with 3-aminopropyltriethoxysilane, condensation reaction products of a silanol-endblocked methylvinylsiloxane oligomer with 3-glycidoxypropyltrimethoxysilane, condensation reaction products of a silanol-endblocked methylvinylsiloxane oligomer with 3-methacryloxypropyltriethoxysilane, and tris(3-trimethoxysilylpropyl)isocyanurate.

This adhesion promoter preferably does not contain an active nitrogen atom, e.g., the amino group, from the standpoint of preventing the decline in optical transmittance and resistance to yellowing that may occur when the cured product is subjected to long-term use under heating. This adhesion promoter is preferably a low-viscosity liquid and preferably is in the range from 1 to 500 mPa·s at 25° C.

This adhesion promoter is incorporated in the composition or optical semiconductor element sealant, specifically encapsulant under consideration in an amount that does not impair the curing characteristics or the characteristics of the cured product, but its quantity of incorporation is not otherwise limited. However, it is incorporated preferably at from 0.01 to 10 weight parts and more preferably at from 0.1 to 5 weight parts, in each case per 100 weight parts of the total of components (A) and (B).

The composition of the present invention and the optical semiconductor element sealant, specifically encapsulant of the present invention may incorporate the following as additional optional components insofar as the objects of the present invention are not impaired: inorganic fillers such as silica, glass, alumina, zinc oxide, and so forth; silicone rubber powder; powders of resins such as silicone resin, polymethacrylate resin, and so forth; heat stabilizers; dyes; pigments; flame retardants; solvents; and so forth.

Based on a consideration of the moldability, the composition of the present invention and the optical semiconductor element sealant, specifically encapsulant of the present invention are preferably liquids at ambient temperature and have a viscosity at 25° C. preferably in the range of 10 to 1,000,000 mPa·s and particularly preferably in the range of 100 to 50,000 mPa·s.

The composition of the present invention, because it is based on the previously described components (A) and (B), provides a cured product that necessarily has a large refractive index at 25° C. for visible light with a wave length of 589 nm and a high optical transmittance for visible light. Its cured product preferably has a refractive index at 25° C. for visible light with a wave length of 589 nm of at least 1.5. The optical transmittance at 25° C. of the cured product from the composition of the present invention is preferably at least 80% and more preferably at least 95% for visible light, specifically in the wave length region of the visible light, that is, in the wave length region of 400 nm to 700 nm.

The cured product from the optical semiconductor element sealant, specifically encapsulant of the present invention has a refractive index at 25° C. for visible light with a wave length of 589 nm of at least 1.5 and an optical transmittance at 25° C. of at least 80% and more preferably at least 95% for visible light, specifically in the wave length region of the visible light, that is, in the wave length region of 400 nm to 700 nm.

The reason for this is that there is a risk that a satisfactory reliability cannot be imparted to an optical semiconductor device that has an optical semiconductor element that has been sealed, specifically encapsulated with a cured product that has a refractive index less than 1.5 and/or an optical transmittance less than 80%—particularly when the optical semiconductor device is a light-emitting diode device that has a light-emitting diode element.

This refractive index can be measured, for example, using an Abbe refractometer. In this case the refractive index can be measured at any desired wavelength by changing the wavelength of the light source in the Abbe refractometer. The optical transmittance under consideration can be determined, for example, by measuring the optical transmittance at 25° C. of the cured product at a wavelength of 450 nm and an optical path length of 0.2 cm using a spectrophotometer.

The composition of the present invention and the optical semiconductor element sealant, specifically encapsulant of the present invention can be cured by standing at room temperature or by the application of heat, but the application of heat is preferred in order to bring about rapid curing. The heating temperature here is preferably in the range from 50 to 200° C.

Even when they do not contain an adhesion promoter, the curable organopolysiloxane composition of the present invention and the optical semiconductor element sealant, specifically encapsulant of the present invention exhibit an excellent initial adhesion and an excellent durability of adhesion—and in particular an excellent durability of adhesion with respect to hot/cold cycling—for metals such as steel, stainless steel, aluminum, copper, silver, titanium, titanium alloys, and so forth; semiconductor elements such as silicon semiconductors, gallium-phosphorus semiconductors, gallium-arsenic semiconductors, gallium nitride semiconductors, and so forth; ceramics; glasses; thermosetting resins; and polar group-containing thermoplastic resins. The curable organopolysiloxane composition of the present invention is useful, for example, as an adhesive, potting agent, encapsulant, protective coating agent, and underfill for electrical and electronic applications. In particular, its high refractive index and high optical transmittance make the curable organopolysiloxane composition of the present invention well suited, for example, as sealants including potting agents, encapsulants, protective coating agents, and underfills for optical semiconductor elements and optical semiconductor devices and as adhesives including die bonding agents for optical semiconductor elements and optical semiconductor devices.

The optical semiconductor device of the present invention will now be described in detail.

The optical semiconductor device of the present invention is characterized in that an optical semiconductor element therein—particularly an optical semiconductor element within a housing—is sealed, specifically encapsulated with a cured product from the previously described optical semiconductor element sealant, specifically encapsulant. This optical semiconductor element can be specifically exemplified by light-emitting diode (LED) elements, semiconductor laser elements, organic EL's, photodiode elements, phototransistor elements, solid-stage imaging elements, and light-receiving elements and light-emitting elements for photocouplers.

The optical semiconductor element is preferably a light-emitting diode (LED) element in view of the high refractive index and high optical transmittance of the cured product from the previously described optical semiconductor element sealant, specifically encapsulant.

The housing here is preferably made of a material to which the optical semiconductor element sealant, specifically encapsulant of the present invention readily adheres, e.g., metal, ceramic, thermosetting resin, or polar group-containing thermoplastic resin, and there are no limitations on its shape and construction.

The metal can be exemplified by stainless steel, aluminum, and duralumin; the thermosetting resin can be exemplified by epoxy resins, phenolic resins, and unsaturated polyester resins; and the polar group-containing thermoplastic resin can be exemplified by polyphthalamide resin, polybutylene terephthalate resin, ABS resin, and liquid-crystal polymers.

The optical semiconductor element sealant, specifically encapsulant of the present invention is preferably cured while in contact with both the optical semiconductor element within the housing and the inner wall of the housing.

The refractive index at 25° C. for visible light with a wavelength of 589 nm and the optical transmittance at 25° C. for visible light of the cured product from the optical semiconductor element sealant, specifically encapsulant under consideration are the same as previously described.

The optical semiconductor device of the present invention can be exemplified by light-emitting diode (LED) devices, photocouplers, CCD's, semiconductor laser devices, optical detectors, optical waveguides, optical waveguide modulators, and optical integrated circuits.

In particular, the optical semiconductor device of the present invention is preferably a light-emitting diode (LED) device in view of the high refractive index and high optical transmittance.

Figure 1:
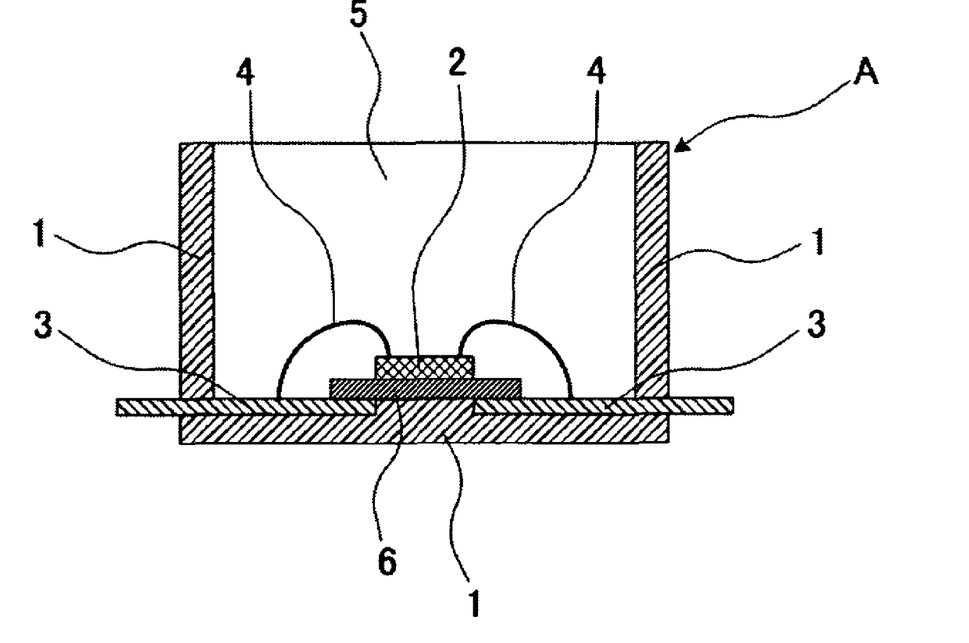
FIG. 1 is a cross-sectional drawing of a surface mount-type light-emitting diode (LED) device that is an example of the optical semiconductor device of the present invention.

FIG. 1 is a cross-sectional drawing of a standalone surface mount-type light-emitting diode (LED) device A that is a representative example of the optical semiconductor device of the present invention. In the light-emitting diode (LED) device A shown in FIG. 1, a light-emitting diode (LED) chip 2 is die bonded on a die pad 6 within a polyphthalamide (PPA) resin housing 1, and this light-emitting diode (LED) chip 2 is wire bonded to an inner lead 3 by a bonding wire 4. This light-emitting diode (LED) chip 2 is sealed, specifically encapsulated along with the housing inner wall by a cured product 5 from the optical semiconductor element sealant, specifically encapsulant of the present invention.

To produce the surface mount-type light-emitting diode (LED) device A shown in FIG. 1, the light-emitting diode (LED) chip 2 is die bonded on the die pad 6 within the polyphthalamide (PPA) resin housing 1 and the light-emitting diode (LED) chip 2 is wire bonded to the inner lead 3 by a gold bonding wire 4. The optical semiconductor element sealant, specifically encapsulant of the present invention is then introduced into the housing 1; degassing is thereafter preferably performed; and curing is then brought about by heating to 50 to 200° C.

EXAMPLES

The curable organopolysiloxane composition, optical semiconductor element encapsulant, i.e., encapsulant for the optical semiconductor element, and optical semiconductor device of the present invention will be described in detail through examples and comparative examples. The viscosity in the examples and comparative examples is the value measured at 25° C. In the examples and comparative examples, Me is methyl; Ph is phenyl; and Vi is vinyl. The properties of the curable organopolysiloxane compositions, the optical semiconductor element encapsulant, and the cured products therefrom were measured as reported below, and the results are given in Table 1. Surface mount-type light-emitting diode (LED) devices were fabricated using the optical semiconductor element encapsulants, and the detachment rate of the cured products was evaluated as reported below and is given in Table 2. While the curable organopolysiloxane composition also denotes the optical semiconductor element encapsulant, the former has been indicated simply with "curable organopolysiloxane composition".

[Content of 1,3,5-trimethyl-1,3,5-triphenylcyclotrisiloxane and 1,3,5,7-tetramethyl-1,3,5,7-tetraphenylcyclotetrasiloxane]

The content of 1,3,5-trimethyl-1,3,5-triphenylcyclotrisiloxane and 1,3,5,7-tetramethyl-1,3,5,7-tetraphenylcyclotetrasiloxane in the curable organopolysiloxane composition was determined by quantitative analysis by headspace gas chromatography using n-undecane as the internal standard. Thus, the relative intensity of 1,3,5-trimethyl-1,3,5-triphenylcyclotrisiloxane and 1,3,5,7-tetramethyl-1,3,5,7-tetraphenylcyclotetrasiloxane with respect to n-undecane was measured in advance using a reference sample and the 1,3,5-trimethyl-1,3,5-triphenylcyclotrisiloxane and 1,3,5,7-tetramethyl-1,3,5,7-tetraphenylcyclotetrasiloxane were determined from the peak intensity on the gas chromatogram and the quantity of n-undecane addition to the sample.

The determination was carried out as follows: approximately 2 g of the sample was weighed into a special 20-mL vial; the vial was encapsulated; heating was performed for 3 hours×150° C. with a G1888 headspace sampler from Agilent Technologies, Inc.; and the determination was performed with a capillary gas chromatograph from Agilent Technologies, Inc. wherein column used: DB-5 from J & W Scientific, column length=30 m, column inner diameter=0.25 mm, liquid phase thickness=0.25 μm. After holding for 5 minutes at 40° C., the column temperature was raised to 250° C. at 10° C./minute and was held there for 5 minutes. A hydrogen flame ionization detector (FID) was used as the detector.

[Refractive Index of the Curable Organopolysiloxane Composition]

The refractive index of the curable organopolysiloxane composition was measured at 25° C. using an Abbe refractometer. Visible light with a wave length of 589 nm was used as the light source.

[Optical Transmittance of the Cured Product from the Curable Organopolysiloxane Composition]

The curable organopolysiloxane composition was introduced between two glass sheets and was cured by holding for 1 hour at 150° C. The optical transmittance of the cured product having optical path length of 0.2 cm was measured at 25° C. using a recording spectrophotometer capable of measurement at any wavelength in the visible range, that is, a wavelength of 400 nm to 700 nm. The optical transmittance was measured on the glass sheet assembly and on the glass sheet by itself and the difference was used as the optical transmittance of the cured product. Table 1 reports the optical transmittance at a wavelength of 450 nm.

[Hardness of the Cured Product from the Curable Organopolysiloxane Composition]

A sheet of the cured product was fabricated by press-molding the curable organopolysiloxane composition for 1 hour at 150° C. The hardness of this cured product sheet was measured using the type A durometer specified in JIS K-6253.

[Adhesive Strength for Polyphthalamide (PPA) Resin Sheet by the Cured Product from the Curable Organopolysiloxane Composition]

Polytetrafluoroethylene resin spacers having a width of 10 mm, a length of 20 mm, and a thickness of 1 mm were sandwiched between 2 polyphthalamide (PPA) resin sheets having a width of 25 mm, a length of 50 mm, and a thickness of 1 mm; the curable organopolysiloxane composition was filled into the gap; this was secured with clips; and curing was performed by holding for 1 hour in a 150° C. convection oven. After cooling to room temperature, the clips and spacers were removed; the polyphthalamide (PPA) resin sheets were pulled in opposite directions along the horizontal using a tensile tester; and the stress at the point of cured product failure was measured.

[Adhesive Strength for Aluminum Sheet by the Cured Product from the Curable Organopolysiloxane Composition]

Polytetrafluoroethylene resin spacers having a width of 10 mm, a length of 20 mm, and a thickness of 1 mm were sandwiched between 2 aluminum sheets having a width of 25 mm, a length of 50 mm, and a thickness of 1 mm; the curable organopolysiloxane composition was filled into the gap; this was secured with clips; and curing was performed by holding for 1 hour in a 150° C. convection oven. After cooling to room temperature, the clips and spacers were removed; the aluminum sheets were pulled in opposite directions along the horizontal using a tensile tester; and the stress at the point of cured product failure was measured.

[Fabrication of Surface Mount-Type Light-Emitting Diode (LED) Devices]

Using a light-emitting diode (LED) device precursor in which an inner lead 3 extended from the side wall toward the center of the interior base region of a closed-bottom cylindrical polyphthalamide (PPA) resin housing 1 having an inner diameter of mm and a depth of 1.0 mm, a light-emitting diode (LED) chip 2 was die bonded on the die pad 6, and the light-emitting diode (LED) chip 2 and inner lead 3 were electrically connected by a bonding wire 4, in the particular example or comparative example the curable organopolysiloxane composition was degassed and introduced into the housing 1 using a dispenser and the composition was cured by heating in an oven for 30 minutes at 100° C. and then 1 hour at 150° C. to fabricate a surface mount-type light-emitting diode (LED) device A as shown in FIG. 1. Sixteen of these were fabricated in each instance.

[Initial Detachment Rate]

The presence/absence of detachment between the cured product from the composition and the inner wall of the housing 1 was observed using an optical microscope for the aforementioned 16 surface mount-type light-emitting diode (LED) devices A. The number in which detachment had occurred/16 was used as the detachment rate.

[Detachment Rate After Holding at Constant Temperature and Constant Humidity]

The aforementioned 16 surface mount-type light-emitting diode (LED) devices A were held for 72 hours in a 30° C./70 RH % atmosphere followed by return to room temperature (25° C.). The presence/absence of detachment between the cured product from the composition and the inner wall of the housing 1, the surface of the light-emitting diode (LED) chip 2, the surface of the inner lead 3, and the surface of the bonding wire 4 was observed using an optical microscope. The number in which detachment had occurred/16 was used as the detachment rate.

[Detachment Rate After Holding for 30 Seconds at 280° C.]

After the aforementioned holding at constant temperature and constant humidity, 16 surface mount-type light-emitting diode (LED) devices A were held for 30 seconds in a 280° C. oven followed by return to room temperature, that is, 25° C. The presence/absence of detachment between the heat cured product from the composition and the inner wall of the housing 1, the surface of the light-emitting diode (LED) chip 2, the surface of the inner lead 3, and the surface of the bonding wire 4 was observed using an optical microscope. The number in which detachment had occurred/16 was used as the detachment rate.

[Detachment Rate After Heat Shock Cycling]

The following temperature cycle (−40° C. to +100° C.) was performed a total of 5 times on 16 surface mount-type light-emitting diode (LED) devices A after the aforementioned holding for 30 seconds at 280° C.: holding for 30 minutes at −40° C., then holding for 30 minutes at +100° C. After then returning to room temperature, the presence/absence of detachment between the cured product from the composition and the inner wall of the housing 1, the surface of the light-emitting diode (LED) chip 2, the surface of the inner lead 3, and the surface of the bonding wire 4 was observed using an optical microscope. The number in which detachment had occurred/16 was used as the detachment rate.

Example 1

The following components were mixed to uniformity to provide a colorless and transparent curable organopolysiloxane composition that had a viscosity of 1,500 mPa·s:
86.7 weight parts of a straight-chain methylphenylpolysiloxane endblocked at both molecular chain terminals by dimethylvinylsiloxy groups wherein viscosity=3,500 mPa·s, silicon-bonded vinyl content=1.48 weight %, silicon-bonded phenyl group content within the total silicon-bonded organic groups=44.7 mole %, total content of 1,3,5-trimethyl-1,3,5-triphenylcyclotrisiloxane and 1,3,5,7-tetramethyl-1,3,5,7-tetraphenylcyclotetrasiloxane=2.7 weight %,
3.0 weight parts of a branched methylphenylhydrogenpolysiloxane represented by the average siloxane unit formula:

$(PhSiO_{3/2})_{0.4}(HMe_2SiO_{1/2})_{0.6}$ wherein viscosity=700 mPa·s, silicon-bonded hydrogen atom content=0.65 weight %, silicon-bonded phenyl group content within the total silicon-bonded organic groups=25 mole %,
10.3 weight parts of a diphenylpolysiloxane endblocked at both molecular chain terminals by dimethylhydrogensiloxy groups wherein viscosity=115 mPa·s, silicon-bonded hydrogen atom content=0.32 weight %, silicon-bonded phenyl content within the total silicon-bonded organic groups=55.6 mole %,
a platinum/1,3-divinyl-1,1,3,3-tetramethyldisiloxane complex in a quantity that provided the composition with 2.5 weight-ppm platinum metal from this complex, and 0.05 weight part of 2-phenyl-3-butyn-2-ol.

The properties of this curable organopolysiloxane composition and the cured product therefrom were measured. The results are reported in Table 1. The reliability evaluations were performed on surface mount-type light-emitting diode (LED) devices A fabricated using this curable organopolysiloxane composition. These results are reported in Table 2.

Example 2

The following components were mixed to uniformity to provide a colorless and transparent curable organopolysiloxane composition that had a viscosity of 2,130 mPa·s:
85.9 weight parts of a straight-chain methylphenylpolysiloxane endblocked at both molecular chain terminals by dimethylvinylsiloxy groups wherein viscosity=3,500 mPa·s, silicon-bonded vinyl content=1.48 weight %, silicon-bonded phenyl group content within the total silicon-bonded organic groups=44.7 mole %, total content of 1,3,5-trimethyl-1,3,5-triphenylcyclotrisiloxane and 1,3,5,7-tetramethyl-1,3,5,7-tetraphenylcyclotetrasiloxane=2.7 weight %,
14.1 weight parts of a branched methylphenylhydrogenpolysiloxane represented by the average siloxane unit formula:

$(PhSiO_{3/2})_{0.6}(HMe_2SiO_{1/2})_{0.4}$ wherein viscosity=2,400 mPa·s, silicon-bonded hydrogen atom content=0.38 weight %, silicon-bonded phenyl group content within the total silicon-bonded organic groups=42.9 mole %,
a platinum/1,3-divinyl-1,1,3,3-tetramethyldisiloxane complex in a quantity that provided the composition with 2.5 weight-ppm platinum metal from this complex, and 0.05 weight part of 2-phenyl-3-butyn-2-ol.

The properties of this curable organopolysiloxane composition and the cured product therefrom were measured. The results are reported in Table 1. The reliability evaluations were performed on surface mount-type light-emitting diode (LED) devices A fabricated using this curable organopolysiloxane composition. These results are reported in Table 2.

Example 3

The following components were mixed to uniformity to provide a colorless and transparent curable organopolysiloxane composition that had a viscosity of 2,160 mPa·s:
55.8 weight parts of a straight-chain methylphenylpolysiloxane endblocked at both molecular chain terminals by dimethylvinylsiloxy groups wherein viscosity=3,500 mPa·s, silicon-bonded vinyl content=1.48 weight %, silicon-bonded phenyl group content within the total silicon-bonded organic groups=44.7 mole %, total content of 1,3,5-trimethyl-1,3,5-triphenylcyclotrisiloxane and 1,3,5,7-tetramethyl-1,3,5,7-tetraphenylcyclotetrasiloxane=2.7 weight %,
20.0 weight parts of a branched methylvinylphenylpolysiloxane represented by the average siloxane unit formula:

$(PhSiO_{3/2})_{0.75}(ViMe_2SiO_{1/2})_{0.25}$ wherein state=solid (25° C.), silicon-bonded vinyl content=5.62 weight %, silicon-bonded phenyl group content within the total silicon-bonded organic groups=50 mole %,
24.2 weight parts of a diphenylpolysiloxane endblocked at both molecular chain terminals by dimethylhydrogensiloxy groups wherein viscosity=115 mPa·s, silicon-bonded hydrogen atom content=0.32 weight %, silicon-bonded phenyl content within the total silicon-bonded organic groups=55.6 mole %,
a platinum/1,3-divinyl-1,1,3,3-tetramethyldisiloxane complex in a quantity that provided the composition with 2.5 weight-ppm platinum metal from this complex, and 0.05 weight part of 2-phenyl-3-butyn-2-ol.

The properties of this curable organopolysiloxane composition and the cured product therefrom were measured. The results are reported in Table 1. The reliability evaluations were performed on surface mount-type light-emitting diode (LED) devices A fabricated using this curable organopolysiloxane composition. These results are reported in Table 2.

Comparative Example 1

The following components were mixed to uniformity to provide a colorless and transparent curable organopolysiloxane composition that had a viscosity of 1,280 mPa·s:
88.1 weight parts of a straight-chain methylphenylpolysiloxane endblocked at both molecular chain terminals by dimethylvinylsiloxy groups wherein viscosity=3,200 mPa·s, silicon-bonded vinyl content=1.37 weight %, silicon-bonded phenyl group content within the total silicon-bonded organic groups=449 mole %, total content of 1,3,5-trimethyl-1,3,5-triphenylcyclotrisiloxane and 1,3,5,7-tetramethyl-1,3,5,7-tetraphenylcyclotetrasiloxane=10.0 weight %, 3.6 weight parts of a branched methylphenylhydrogenpolysiloxane represented by the average siloxane unit formula:

$(PhSiO_{3/2})_{0.4}(HMe_2SiO_{1/2})_{0.6}$ wherein viscosity=700 mPa·s, silicon-bonded hydrogen atom content=0.65 weight %, silicon-bonded phenyl group content within the total silicon-bonded organic groups=25 mole %,
8.3 weight parts of a diphenylpolysiloxane endblocked at both molecular chain terminals by dimethylhydrogensiloxy groups wherein viscosity=115 mPa·s, silicon-bonded hydrogen content=0.32 weight %, silicon-bonded phenyl content within the total silicon-bonded organic groups=55.6 mole %,
a platinum/1,3-divinyl-1,1,3,3-tetramethyldisiloxane complex in a quantity that provided the composition with 2.5 weight-ppm platinum metal from this complex, and
0.05 weight part of 2-phenyl-3-butyn-2-ol.

The properties of this curable organopolysiloxane composition and the cured product therefrom were measured. The results are reported in Table 1. The reliability evaluations were performed on surface mount-type light-emitting diode (LED) devices A fabricated using this curable organopolysiloxane composition. These results are reported in Table 2.

Comparative Example 2

The following components were mixed to uniformity to provide a colorless and transparent curable organopolysiloxane composition that had a viscosity of 1,650 mPa·s:
86.0 weight parts of a straight-chain methylphenylpolysiloxane endblocked at both molecular chain terminals by dimethylvinylsiloxy groups wherein viscosity=3,050 mPa·s, silicon-bonded vinyl content=1.23 weight %, silicon-bonded phenyl group content within the total silicon-bonded organic groups=45.3 mole %, total content of 1,3,5-trimethyl-1,3,5-triphenylcyclotrisiloxane and 1,3,5,7-tetramethyl-1,3,5,7-tetraphenylcyclotetrasiloxane=19.4 weight %,
14.0 weight parts of a branched methylphenylhydrogenpolysiloxane represented by the average siloxane unit formula:

$(PhSiO_{3/2})_{0.6}(HMe_2SiO_{1/2})_{0.4}$ wherein viscosity=2,400 mPa·s, silicon-bonded hydrogen atom content=0.38 weight %, silicon-bonded phenyl group content within the total silicon-bonded organic groups=42.9 mole %,
a platinum/1,3-divinyl-1,1,3,3-tetramethyldisiloxane complex in a quantity that provided the composition with 2.5 weight-ppm platinum metal from this complex, and
0.05 weight part of 2-phenyl-3-butyn-2-ol.

The properties of this curable organopolysiloxane composition and the cured product therefrom were measured. The results are reported in Table 1. The reliability evaluations were performed on surface mount-type light-emitting diode (LED) devices A fabricated using this curable organopolysiloxane composition. These results are reported in Table 2.

Comparative Example 3

The following components were mixed to uniformity to provide a colorless and transparent curable organopolysiloxane composition that had a viscosity of 1,770 mPa·s:
56.8 weight parts of a straight-chain methylphenylpolysiloxane endblocked at both molecular chain terminals by dimethylvinylsiloxy groups wherein viscosity=3,170 mPa·s, silicon-bonded vinyl content=0.20 weight %, silicon-bonded phenyl group content within the total silicon-bonded organic groups=49 mole %, total content of 1,3,5-trimethyl-1,3,5-triphenylcyclotrisiloxane and 1,3,5,7-tetramethyl-1,3,5,7-tetraphenylcyclotetrasiloxane=6 weight %, 20.0 weight parts of a branched methylphenylvinylpolysiloxane represented by the average siloxane unit formula:

$(PhSiO_{3/2})_{0.75}(ViMe_2SiO_{1/2})_{0.25}$ wherein state=solid (25° C.), silicon-bonded vinyl content=5.62 weight %, silicon-bonded phenyl group content within the total silicon-bonded organic groups=50 mole %,
23.2 weight parts of a diphenylpolysiloxane endblocked at both molecular chain terminals by dimethylhydrogensiloxy groups wherein viscosity=115 mPa·s, silicon-bonded hydrogen atom content=0.32 weight %, silicon-bonded phenyl content within the total silicon-bonded organic groups=55.6 mole %,
a platinum/1,3-divinyl-1,1,3,3-tetramethyldisiloxane complex in a quantity that provided the composition with 2.5 weight-ppm platinum metal from this complex, and
0.05 weight part of 2-phenyl-3-butyn-2-ol.

The properties of this curable organopolysiloxane composition and the cured product therefrom were measured. The results are reported in Table 1. The reliability evaluations were performed on surface mount-type light-emitting diode (LED) devices A fabricated using this curable organopolysiloxane composition. These results are reported in Table 2.

TABLE 1

|  | Example 1 | Example 2 | Example 3 | Comparative Example 1 | Comparative Example 2 | Comparative Example 3 |
|---|---|---|---|---|---|---|
| refractive index of the composition | 1.543 | 1.541 | 1.547 | 1.542 | 1.541 | 1.547 |
| optical transmittance of the cured product | 99.8% | 99.7% | 99.7% | 99.7% | 99.8% | 99.6% |
| hardness of the cured product | 10 | 30 | 4 | 14 | 30 | 3 |
| adhesive strength by the cured product for PMA resin sheet (MPa) | 4 | 6 | 3 | 4 | 5 | 2 |
| adhesive strength by the cured product for Al sheet (MPa) | 5 | 5 | 3 | 3 | 5 | 2 |

TABLE 2

|  | Example 1 | Example 2 | Example 3 | Comparative Example 1 | Comparative Example 2 | Comparative Example 3 |
|---|---|---|---|---|---|---|
| initial detachment rate of the cured product | 0% | 0% | 0% | 0% | 0% | 0% |
| detachment rate after holding at constant temperature and constant humidity | 0% | 0% | 0% | 18.8% | 50% | 25% |
| detachment rate after holding for 30 seconds at 280° C. | 0% | 0% | 0% | 68.8% | 100% | 75% |

TABLE 2-continued

|  | Example 1 | Example 2 | Example 3 | Comparative Example 1 | Comparative Example 2 | Comparative Example 3 |
|---|---|---|---|---|---|---|
| detachment rate after heat shock cycling | 0% | 0% | 0% | 50% | 100% | 68.8% |

INDUSTRIAL APPLICABILITY

The curable organopolysiloxane composition of the present invention is useful, for example, as an adhesive, potting agent, encapsulant, protective coating agent, and underfill for electrical and electronic applications. In particular, its high optical transmittance make the curable organopolysiloxane composition of the present invention useful, for example, as a sealant including potting agents, encapsulants, protective coating agents, and underfills for optical semiconductor elements and optical semiconductor devices and as an adhesive including die bonding agents for optical semiconductor elements and optical semiconductor devices. The optical semiconductor element sealant of the present invention is useful as a sealant including potting agents, encapsulants, protective coating agents, and underfills for optical semiconductor elements. The optical semiconductor device of the present invention is useful as an optical semiconductor device such as an optical device, an optical apparatus or instrument, a lighting apparatus, a lighting device, and so forth.

DESCRIPTION OF THE REFERENCE SYMBOLS

A surface mount-type light-emitting diode (LED) device
1 polyphthalamide (PPA) resin housing
2 light-emitting diode (LED) chip
3 inner lead
4 bonding wire
5 cured product from the optical semiconductor element encapsulant
6 die pad

The invention claimed is:

1. A curable organopolysiloxane composition that comprises
    (A) a diorganopolysiloxane that has at least 2 alkenyl groups in one molecule wherein at least 70 mole % of all the siloxane units in the diorganopolysiloxane are methylphenylsiloxane units and the total content of 1,3,5-trimethyl-1,3,5-triphenylcyclotrisiloxane and 1,3,5,7-tetramethyl-1,3,5,7-tetraphenylcyclotetrasiloxane is no more than 5 weight %,
    (B) an organopolysiloxane that has at least 2 silicon-bonded hydrogen atoms in one molecule wherein at least 15 mole % of the silicon-bonded organic groups in the organopolysiloxane are phenyl groups
        in a quantity that provides 10 to 500% for the number of moles of silicon-bonded hydrogen atoms in component (B) relative to the total number of moles of alkenyl groups in component (A), and
    (C) a hydrosilylation reaction catalyst in a quantity sufficient to cure the composition.

2. The curable organopolysiloxane composition according to claim 1, characterized in that
    component (A) is a diorganopolysiloxane represented by the following average structural formula (1):

wherein Me is methyl; Ph is phenyl; $R^1$ is alkenyl, methyl, and phenyl; at least 2 of the $R^1$ groups in one molecule are alkenyl groups; the sum of n and m is a number with an average from 5 to 1,000; and m/n is no greater than 0.2, and component (B) is an organohydrogenpolysiloxane selected from a straight-chain organohydrogenpolysiloxane represented by the following average structural formula (2):

wherein $R^2$ is hydrogen, methyl, or phenyl; at least 2 of the $R^2$ groups in one molecule are hydrogen atoms; at least 15 mole % of the non-hydrogen $R^2$ groups are phenyl groups; and p is a number with an average of 0 to 1,000 and a branched organohydrogenpolysiloxane represented by the following average siloxane unit formula (3):

$$R^3{}_a H_b SiO_{(4-a-b)/2} \quad (3)$$

wherein $R^3$ is methyl and phenyl and at least 15 mole % of the $R^3$ groups are phenyl groups; a is a number with an average of $0.5 \leq a < 2.0$; b is a number with an average of $0.5 \leq b < 2.0$; and a+b is a number with an average of $1.0 \leq a+b < 2.0$.

3. The curable organopolysiloxane composition according to claim 2, that further comprises a methylphenylalkenylpolysiloxane represented by the following average unit formula (4):

$$R^4{}_c SiO_{(4-c)/2} \quad (4)$$

wherein $R^4$ is alkenyl, methyl, and phenyl wherein at least 20 mole % of the $R^4$ groups are phenyl groups, and c is a positive number with an average of 0.5 to 1.7,
at up to 50 weight % with reference to the total quantity of components (A) and (B).

4. The curable organopolysiloxane composition according to claim 1, that further comprises a methylphenylalkenylpolysiloxane represented by the following average unit formula (4):

$$R^4{}_c SiO_{(4-c)/2} \quad (4)$$

wherein $R^4$ is alkenyl, methyl, and phenyl wherein at least 20 mole % of the $R^4$ groups are phenyl groups, and c is a positive number with an average of 0.5 to 1.7 at up to 50 weight % with reference to the total quantity of components (A) and (B).

5. The curable organopolysiloxane composition according to claim 4, that forms a cured product that has a refractive index at 25° C. for visible light with a wave length of 589 nm of at least 1.5 and an optical transmittance at 25° C. for visible light of at least 80%.

6. The curable organopolysiloxane composition according to claim 1, that forms a cured product that has a refractive index at 25° C. for visible light with a wave length of 589 nm of at least 1.5 and an optical transmittance at 25° C. for visible light of at least 80%.

7. An optical semiconductor element sealant that comprises
(A) a diorganopolysiloxane that has at least 2 alkenyl groups in one molecule wherein at least 70 mole % of all the siloxane units in the diorganopolysiloxane are methylphenylsiloxane units and the total content of 1,3,5-trimethyl-1,3,5-triphenylcyclotrisiloxane and 1,3,5,7-tetramethyl-1,3,5,7-tetraphenylcyclotetrasiloxane is no more than 5 weight %,
(B) an organopolysiloxane that has at least 2 silicon-bonded hydrogen atoms in one molecule wherein at least 15 mole % of the silicon-bonded organic groups in the organopolysiloxane are phenyl groups in a quantity that provides 10 to 500% for the number of moles of silicon-bonded hydrogen atoms in component (B) relative to the total number of moles of alkenyl groups in component (A), and
(C) a hydrosilylation reaction catalyst in a quantity sufficient to cure the composition, and
forms a cured product that has a refractive index at 25° C. for visible light with a wave length of 589 nm of at least 1.5 and an optical transmittance at 25° C. for visible light of at least 80%.

8. The optical semiconductor element sealant according to claim 7, characterized in that
component (A) is a diorganopolysiloxane represented by the following average structural formula (1):

wherein Me is methyl; Ph is phenyl; $R^1$ is alkenyl, methyl, and phenyl; at least 2 of the $R^1$ groups in one molecule are alkenyl groups; the sum of n and m is a number with an average from 5 to 1,000; and m/n is no greater than 0.2, and
component (B) is an organohydrogenpolysiloxane selected from a straight-chain organohydrogenpolysiloxane represented by the following average structural formula (2):

wherein $R^2$ is hydrogen, methyl, or phenyl; at least 2 of the $R^2$ groups in one molecule are hydrogen atoms; at least 15 mole % of the non-hydrogen $R^2$ groups are phenyl groups; and p is a number with an average of 0 to 1,000 and
a branched organohydrogenpolysiloxane represented by the following average unit formula (3):

wherein $R^3$ is methyl and phenyl and at least 15 mole % of the $R^3$ groups are phenyl groups; a is a number with an average of $0.5 \leq a < 2.0$; b is a number with an average of $0.5 \leq b < 2.0$; and a+b is a number with an average of $1.0 \leq a+b < 2.0$.

9. The optical semiconductor element sealant according to claim 8, that further comprises a methylphenylalkenylpolysiloxane represented by the following average unit formula (4):

wherein $R^4$ is alkenyl, methyl, and phenyl wherein at least 20 mole % of the $R^4$ groups are phenyl groups, and c is a positive number with an average of 0.5 to 1.7 at up to 50 weight % with reference to the total quantity of components (A) and (B).

10. The optical semiconductor element sealant according to claim 7, that further comprises a methylphenylalkenylpolysiloxane represented by the following average unit formula (4):

wherein $R^4$ is alkenyl, methyl, and phenyl wherein at least 20 mole % of the $R^4$ groups are phenyl groups, and c is a positive number with an average of 0.5 to 1.7 at up to 50 weight % with reference to the total quantity of components (A) and (B).

11. An optical semiconductor device that is provided with an optical semiconductor element, characterized in that the optical semiconductor element is sealed with a cured product from an optical semiconductor element sealant according to claim 10.

12. The optical semiconductor device according to claim 11, characterized in that the optical semiconductor device is provided with an optical semiconductor element within a housing and in that this optical semiconductor element is sealed, along with the inner wall of the housing, with a cured product from an optical semiconductor element sealant comprising
(A) a diorganopolysiloxane that has at least 2 alkenyl groups in one molecule wherein at least 70 mole % of all the siloxane units in the diorganopolysiloxane are methylphenylsiloxane units and the total content of 1,3,5-trimethyl-1,3,5-triphenylcyclotrisiloxane and 1,3,5,7-tetramethyl-1,3,5,7-tetraphenylcyclotetrasiloxane is no more than 5 weight %,
(B) an organopolysiloxane that has at least 2 silicon-bonded hydrogen atoms in one molecule wherein at least 15 mole % of the silicon-bonded organic groups in the organopolysiloxane are phenyl groups
in a quantity that provides 10 to 500% for the number of moles of silicon-bonded hydrogen atoms in component (B) relative to the total number of moles of alkenyl groups in component (A),
(C) a hydrosilylation reaction catalyst in a quantity sufficient to cure the composition, and
a methylphenylalkenylpolysiloxane represented by the following average unit formula (4):

wherein $R^4$ is alkenyl, methyl, and phenyl wherein at least 20 mole % of the $R^4$ groups are phenyl groups, and c is a positive number with an average of 0.5 to 1.7 at up to 50 weight % with reference to the total quantity of components (A) and (B), and the cured product that has a refractive index at 25° C. for visible light with a wave length of 589 nm of at least 1.5 and an optical transmittance at 25° C. for visible light of at least 80%.

13. The optical semiconductor element sealant according to claim 7, characterized in that the optical semiconductor element is a light-emitting semiconductor element.

14. The optical semiconductor element sealant according to claim 13, characterized in that the light-emitting semiconductor element is a light-emitting diode element.

15. An optical semiconductor device that is provided with an optical semiconductor element, characterized in that the optical semiconductor element is sealed with a cured product from an optical semiconductor element sealant according to claim 7.

16. The optical semiconductor device according to claim 15, characterized in that the optical semiconductor device is provided with an optical semiconductor element within a housing and in that this optical semiconductor element is sealed, along with the inner wall of the housing, with a cured product from an optical semiconductor element sealant comprising:
- (A) a diorganopolysiloxane that has at least 2 alkenyl groups in one molecule wherein at least 70 mole % of all the siloxane units in the diorganopolysiloxane are methylphenylsiloxane units and the total content of 1,3,5-trimethyl-1,3,5-triphenylcyclotrisiloxane and 1,3,5,7-tetramethyl-1,3,5,7-tetraphenylcyclotetrasiloxane is no more than 5 weight %,
- (B) an organopolysiloxane that has at least 2 silicon-bonded hydrogen atoms in one molecule wherein at least 15 mole % of the silicon-bonded organic groups in the organopolysiloxane are phenyl groups in a quantity that provides 10 to 500% for the number of moles of silicon-bonded hydrogen atoms in component (B) relative to the total number of moles of alkenyl groups in component (A), and
- (C) a hydrosilylation reaction catalyst in a quantity sufficient to cure the composition, and the cured product that has a refractive index at 25° C. for visible light with a wave length of 589 nm of at least 1.5 and an optical transmittance at 25° C. for visible light of at least 80%.

* * * * *

UNITED STATES PATENT AND TRADEMARK OFFICE
CERTIFICATE OF CORRECTION

PATENT NO. : 8,373,286 B2  Page 1 of 1
APPLICATION NO. : 13/062374
DATED : February 12, 2013
INVENTOR(S) : Makoto Yoshitake et al.

It is certified that error appears in the above-identified patent and that said Letters Patent is hereby corrected as shown below:

In the Claims

Claim 2, Column 24, line 12, after "1,000; and", delete "mmn" and insert -- m/n --.

Signed and Sealed this
Seventeenth Day of September, 2013

Teresa Stanek Rea
*Deputy Director of the United States Patent and Trademark Office*